US012727255B2

(12) United States Patent
Lin et al.

(10) Patent No.: US 12,727,255 B2
(45) Date of Patent: Sep. 1, 2026

(54) SEMICONDUCTOR STRUCTURE AND METHOD OF PREVENTING CHARGING DAMAGE THEREOF

(71) Applicant: UNITED MICROELECTRONICS CORP., Hsin-Chu City (TW)

(72) Inventors: Ming-Te Lin, Hsinchu City (TW); Wen-Chun Chang, Hsinchu City (TW); Sung-Nien Kuo, Hsinchu City (TW); Tzu-Chun Chen, Hsinchu City (TW); Kuan-Cheng Su, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 282 days.

(21) Appl. No.: 18/242,502

(22) Filed: Sep. 5, 2023

(65) Prior Publication Data

US 2025/0031458 A1 Jan. 23, 2025

(30) Foreign Application Priority Data

Jul. 19, 2023 (TW) ................................ 112126891

(51) Int. Cl.
*H10D 89/60* (2025.01)
*H10W 20/42* (2026.01)

(52) U.S. Cl.
CPC ......... *H10D 89/811* (2025.01); *H10D 89/611* (2025.01); *H10W 20/42* (2026.01)

(58) Field of Classification Search
CPC ............... H10D 89/811; H10D 89/611; H01L 23/5226; H10W 20/42
USPC ........................................................ 257/355
See application file for complete search history.

(56) References Cited

U.S. PATENT DOCUMENTS

2024/0371854 A1* 11/2024 Hsu ..................... H10D 89/711

OTHER PUBLICATIONS

Martin ,2022 IEEE International Integrated Reliability Workshop (IIRW)—Plasma induced charging damage (PID) from well charging in a BCD technology with deep trenches causing MOS device reliability lifetime degradation ,Oct. 9, 2022.

* cited by examiner

*Primary Examiner* — Tu-Tu V Ho
(74) *Attorney, Agent, or Firm* — Winston Hsu

(57) ABSTRACT

A semiconductor structure is provided in the present invention, including a substrate, a deep N-well formed in the substrate, a first well formed in the deep N-well, a first gate formed on the first well, a first source and a first drain formed respectively at two sides of the first gate in the first well, a first doped region formed in the first well, and a metal interconnect electrically connected with the first source and the first doped region, wherein an area of the deep N-well multiplied by a first parameter is a first factor, an area of the first gate multiplied by a second parameter is a second factor, and an area of the metal interconnect divided by a sum of the first factor and the second factor is less than a specification value.

13 Claims, 4 Drawing Sheets

SEMICONDUCTOR STRUCTURE AND METHOD OF PREVENTING CHARGING DAMAGE THEREOF

BACKGROUND OF THE INVENTION

1. Field of the Invention

The present invention relates generally to a semiconductor structure, and more specifically, to a semiconductor structure with metal interconnects and method of preventing charging damage thereof.

2. Description of the Prior Art

Plasma induced damage (PID) is a well-known damage mechanism in semiconductor industry, whose principle is that metal interconnects (ex. antenna) connected with gates would cause overvoltage due to excess charging during semiconductor processes, which may further punch through gate oxide layer, thereby causing gate leakage and reduce reliability. Recent research found that large-area isolated wells, ex. deep N-well (DNW), may possibly be charged due to the connection of metal interconnects and the sources, drains and doped regions therein, thereby inducing a current punching reversely through the gate oxide layer from the substrate. Accordingly, evaluating the influence of well charging mechanism to gate structures is very critical to process verification and circuit design, especially in the design of embedded high-voltage (eHV) devices, whose high-voltage property may easily cause well charging induced damage.

Currently, well antenna rule is usually adopted in the industry to evaluate the safety operation area (SOA) of the device, wherein area factors of isolated deep well are considered to define the area of antenna in the design. However, with regard to the damage of gate structure, this kind of well antenna rule doesn't take into account essential and relevant gate factors. Furthermore, this kind of well antenna rule is usually derived from data fitting rather than deduced from relevant charging mechanism and equivalent circuits, lacking of actual physical model basis, thus it needs to be modified frequently since more data is received in different products and processes, and usually doesn't match with actual test results. Besides, due to the reason above, it can't be applied extensively and availably to other complicated well antenna circuits and structures. In view of the existing circumstance above, those of skilled in the art need to improve current approach of well antenna rule, in hope that it may be applied more availably and suitably to process verification and evaluation of well charging damage.

SUMMARY OF THE INVENTION

In the light of the shortcoming of the aforementioned conventional approach, the present invention hereby provides a novel semiconductor structure and method of preventing charging damage thereof, with feature of introducing gate area factor, so that deduced well antenna rule and specification can be made based on actual physical model, and the safe operation area (SOA) defined therefrom can be more conform to actual test results, thereby providing better adaptability to be applied in other variants of antenna circuits and structures.

One aspect of the present invention is to provide a semiconductor structure, including a substrate, a deep N-well formed in the substrate, a first well formed in the deep N-well, a first gate formed on the first well, a first source and a first drain formed respectively at two sides of the first gate in the first well, a first doped region formed in the first well, and a metal interconnect electrically connecting with the first source and the first doped region, wherein an area of the deep N-well multiplied by a first parameter is a first factor, an area of the first gate multiplied by a second parameter is a second factor, and an area of the metal interconnect divided by a sum of the first factor and the second factor is less than a specification value.

Another aspect of the present invention is to provide a semiconductor structure, including a substrate, a deep N-well formed in the substrate, a first well formed in the deep N-well, a first gate formed on the first well, a first source and a first drain formed respectively at two sides of the first gate in the first well, a first doped region formed in the first well, a metal interconnect electrically connecting with the first source and the first doped region, and a protection diode with a second well formed in the substrate and a second doped region formed in the second well, wherein the metal interconnect is electrically connected with the second doped region of the protection diode.

Still another aspect of the present invention is to provide a method of preventing a semiconductor structure from charging damage, including steps of providing a semiconductor structure, and the semiconductor structure includes a substrate, a deep N-well formed in the substrate, a first well formed in the deep N-well, a first gate formed on the first well, a first source and a first drain formed respectively at two sides of the first gate in the first well, and a first doped region formed in the first well. Provide a metal interconnect electrically connecting with the first source and the first doped region, wherein an area of the deep N-well multiplied by a first parameter is a first factor, an area of the first gate multiplied by a second parameter is a second factor, and an area of the metal interconnect divided by a sum of the first factor and the second factor is less than a specification value.

These and other objectives of the present invention will no doubt become obvious to those of ordinary skill in the art after reading the following detailed description of the preferred embodiment that is illustrated in the various figures and drawings.

Figure 1:
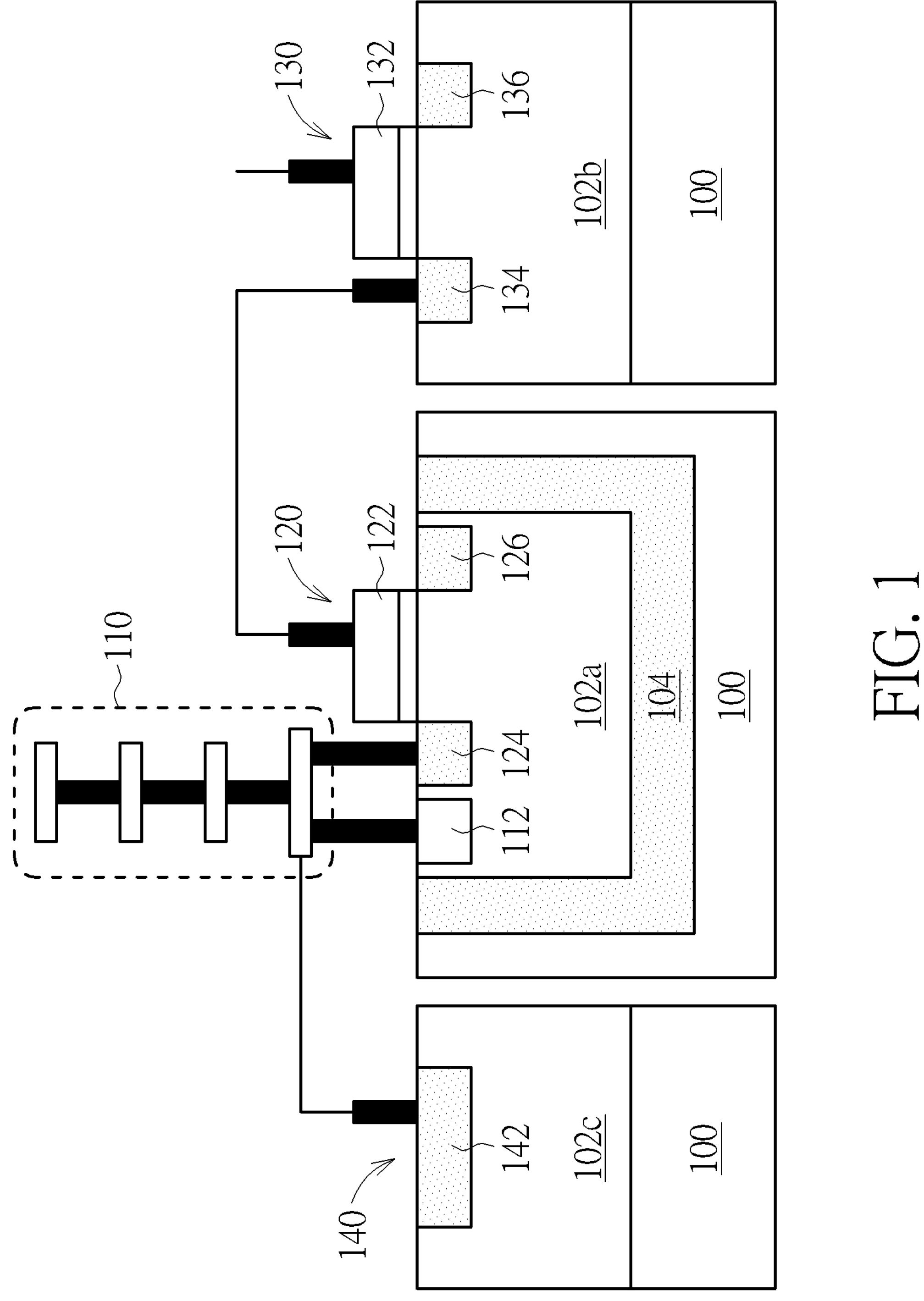
FIG. 1 is a cross-section of a semiconductor structure capable of preventing charging damage in accordance with one embodiment of present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The method of preventing semiconductor structures from charging damage provided in the present invention is specifically applied in particular semiconductor structure with corresponding components and factors. This kind of semiconductor structure may be testkey structures on wafer scribe lines, which is particularly suitable for the semiconductor design with large metal interconnect area (ex. antenna) electrically connecting to a device well, and may contribute to the establish of safe operation area (SOA) and design rule that comply with real circuit structure and capable of preventing plasma charging damage during the process.

Please refer to FIG. 1, which is a schematic cross-section of a semiconductor structure capable of preventing charging damage in accordance with one embodiment of present invention. As shown in FIG. 1, the semiconductor structure of present invention includes a substrate 100. The material of substrate 100 is preferably silicon substrate, ex. a P-type lightly doped silicon substrate with trivalent element like aluminum (Al), boron (B), gallium (Ga) doped therein. Other silicon-based substrate may also be adopted, including but not limit to I-V compound on silicon substrate (ex. GaN-on-silicon), silicon-on-insulator (SOI) or substrate with other doping type. A deep N-type well (DNW) 104 is formed in the substrate 100 with pentavalent element like phosphorus (P), arsenic (As), tellurium (Te) doped therein to define an isolated device region. A well 102*a*, ex. P-type doped well, formed in the deep N-type well 104 as an active area of the device. Active areas for different devices may be isolated through shallow trench isolations (STIs, not shown). In this embodiment, a first gate 122 is formed on the defined well 102*a*, and a first source 124 and a first drain 126, ex. N-type heavily doped regions, are formed respectively at two sides of the first gate 122 in the well 102*a*, so as to constitute collectively a first transistor 120, ex. NMOS transistor. A metal interconnect 110, especially antenna structure with large area, is formed on the substrate 100, which may be constituted by metal layers and vias in BEOL (back-end-of-line) structure and electrically connected with the first source 124 of first transistor 120. In the embodiment of present invention, a first doped region 112, ex. P-type heavily doped region, may be further formed in the well 102*a* adjacent to the first source 124. The metal interconnect 110 is also electrically connected with the first doped region 112 to provide a path connecting to bulk, in order to improve the tolerance of transistors under high operating voltage.

Refer to FIG. 1. In the embodiment of present invention, the first gate 122 of first transistor 120 is further electrically connected to a second source 134 of a second transistor 130 in another active area through interconnect. The second transistor 130 is constituted by the second gate 132 on the well 102*b* as well as the second source 134 and second drain 136 formed respectively at two sides of the second gate 132 in the well 102*b*. In actual process, large-area metal interconnect 110 would collect a large amount of positive charges in plasma ambience. These charges will accumulate in the deep N-type well 104 of substrate 100 through connecting circuits, so as to increase the gate voltage of first transistor 120 in the region and induce the discharge of accumulated charges through the conductive path of first gate 122 and second source 134 connected therewith, thereby causing the punch-through issue of gate oxide layer of the first transistor 120, damaging the device and reduce its reliability. Accordingly, conventional solution for this issue is to establish a rule for to evaluate the safe operation area (SOA) of devices, wherein area factor of deep N-well 104 and area factor of metal interconnect 110 where the charges accumulate are considered as references for circuit design and process verification. However, with regard to the damage of gate structure, this well antenna rule doesn't take into account essential gate factors, thus it lacks of actual physical model basis and usually doesn't match with actual test results, and accordingly, it can't be applied widely to other well antenna circuits and structures.

For this reason, the present invention provides a novel well antenna rule with a formula as follow:

$$Spec > \frac{A_{ant}}{C1 \cdot A_{dnw} + C2 \cdot A_{gate}}$$

wherein Spec is a specification value, $A_{ant}$ is the area of metal interconnect 110, $A_{dnw}$ is the area of deep N-well 104, $A_{gate}$ is the area of first gate 122, C1 is a first parameter, C2 is a second parameter. In the rule established by the present invention, the area $A_{dnw}$ Of deep N-well 114 multiplied by the first parameter C1 is a first factor, the area $A_{gate}$ of first gate 122 multiplied by the second parameter C2 is a second factor, the area $A_{ant}$ of metal interconnect 110 divided by the sum of the first factor and the second factor should be less than the specification value Spec. Please note that in the present invention, specification value Spec, first parameter C1, second parameter C2 may vary depending on corresponding semiconductor structures or processes. For example, the well antenna rules for different products may have different specification values Spec, first parameters C1, second parameters C2, which may be deduced from the curve of leakage current of the first gate 122.

The advantage of well antenna rule above provided by the present invention is the introduce of gate factors, which may make its physical model basis more closer to the punch-through mechanism of gate oxide resulted from the aforementioned well charging phenomenon, more compliant with the actual test results. Furthermore, it also provides quantified gate factors as evaluating references for process verification and circuit design.

In addition to the aforementioned well antenna rule provided by the present invention, in the embodiment of present invention, the damage issue caused by well charging may be mitigated by setting a protection diode. As shown in FIG. 1, the metal interconnect 110 is electrically connected to a protection diode 140 through interconnect. The protection diode 140 includes a second doped region 142, ex. a N-type heavily doped region formed in the well 102*c*. With this design, the protection diode 140 and the first transistor 120 are connected in parallel to the metal interconnect 110. When the circuit operates normally, the protection diode 140 is in OFF state and consumes a certain amount of leakage current. When overvoltage is produced by the metal interconnect 110 in the plasma ambience of process, the protection diode 140 will be switched to ON state and starts to consume pulse current, thereby inhibiting overvoltage and protecting the first transistor 120 from the influence of the pulse current.

In the embodiment of FIG. 1, the gate oxide layer to be protected is on a source well 102*a* where the charging phenomenon occurs, the first gate 122 on the gate oxide layer is connected to a second source 134 of a second transistor 130 in the remote well 102*b* through metal interconnects, so as to induce a discharging path from the source well 102*a* to the remote well 102*b* through the gate oxide layer. However, since the well antenna rule of present invention is established based on the physical model of actual circuit, it can also be applied to other variations of well antenna circuit and structure.

Figure 2:
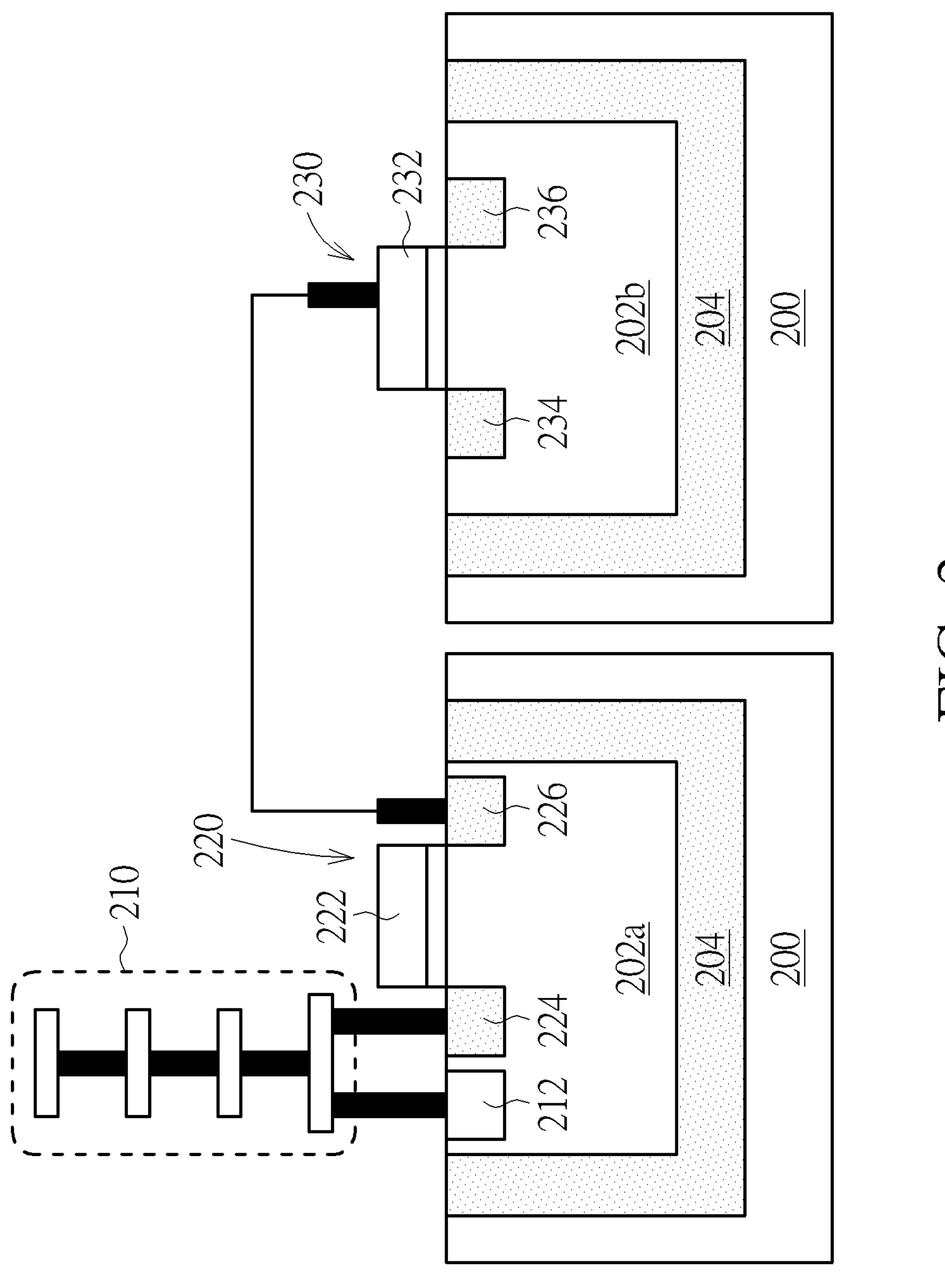
FIG. 2 is a cross-section of a semiconductor structure capable of preventing charging damage in accordance with another embodiment of present invention.

Please refer now to FIG. 2, which is a cross-section of a semiconductor structure capable of preventing charging damage in accordance with another embodiment of present invention. In the embodiment of FIG. 2, the first transistor 220 on the source well 202*a* is electrically connected to a second gate 232 of a second transistor 230 on a remote well 202*b*. In this way, when a large amount of charges are charged and accumulated in the deep N-well 204 of the source well, charging damage will occur in the punched gate oxide layer of remote second transistor 230. Regarding to this kind of circuit, the aforementioned well antenna rule and formula of present invention is still practicable, with only the difference that the area $A_{gate}$ in the formula is replaced with the area of second 232. In comparison thereto, conventional well antenna rules are not provided or introduced with any gate factors, thus they can't be applied in the circuit variants like the embodiment of FIG. 2.

Figure 3:
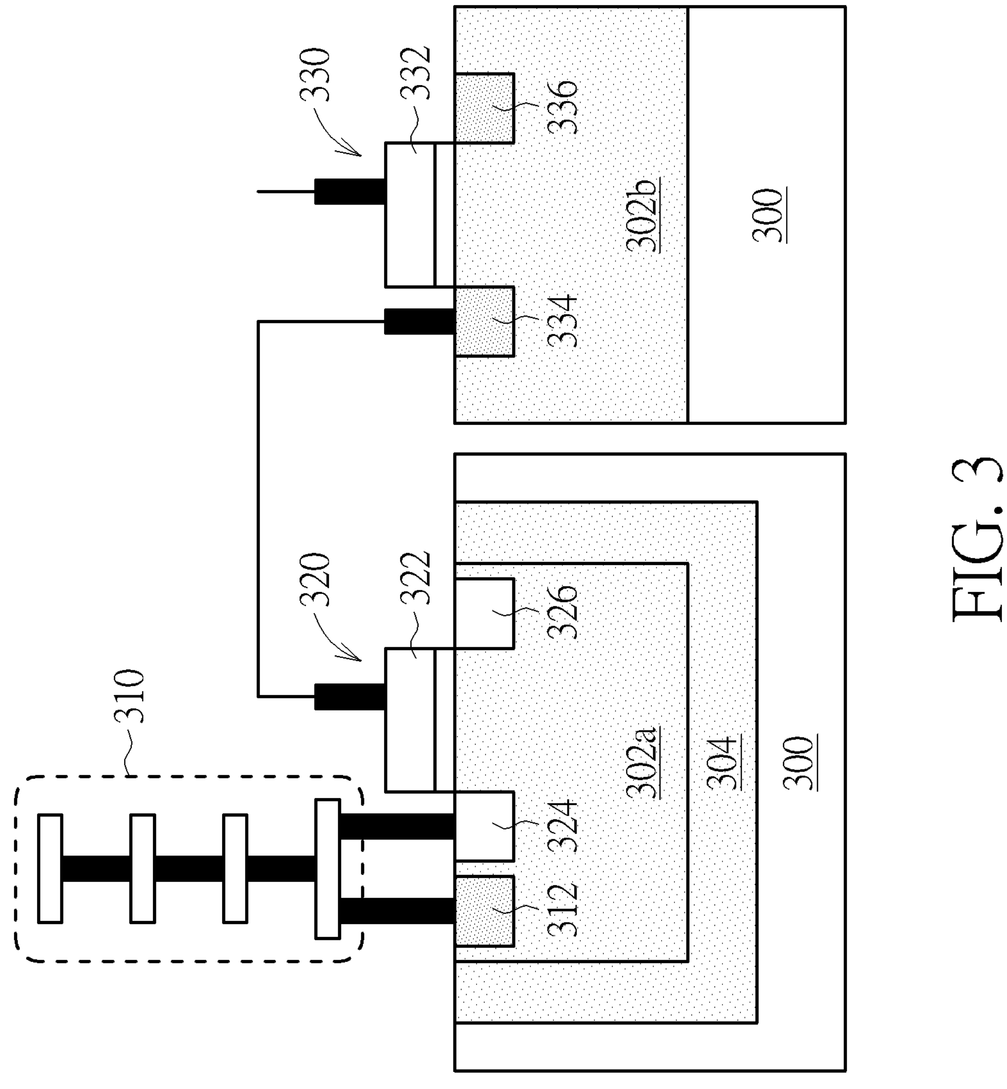
FIG. 3 is a cross-section of a semiconductor structure capable of preventing charging damage in accordance with still another embodiment of present invention.

Please refer now to FIG. 3, which is a cross-section of a semiconductor structure capable of preventing charging damage in accordance with still another embodiment of present invention. The well antenna rule of present invention may also be applied in PMOS transistor. As shown in FIG. 3, the structure of this embodiment is similar to the embodiment of FIG. 1, with differences that the wells 302*a*, 302*b* therein are replaced with N-type doped wells, the first source 324 and first drain 326 of first transistor 320 are replaced with P-type heavily doped regions, and the first doped region 312 connecting the bulk is replaced with N-type heavily doped region. Similarly, the second source 334 and second drain 336 of second transistor 330 connected therewith are replaced with P-type heavily doped regions, so as to constitute a PMOS transistor structure. When the well charging phenomenon occurs, a large amount of charges accumulated in the deep N-well 304 are discharged in the same path from the gate oxide layer of first transistor 320 to the well 302*b* of second transistor 330 through metal interconnects.

Figure 4:
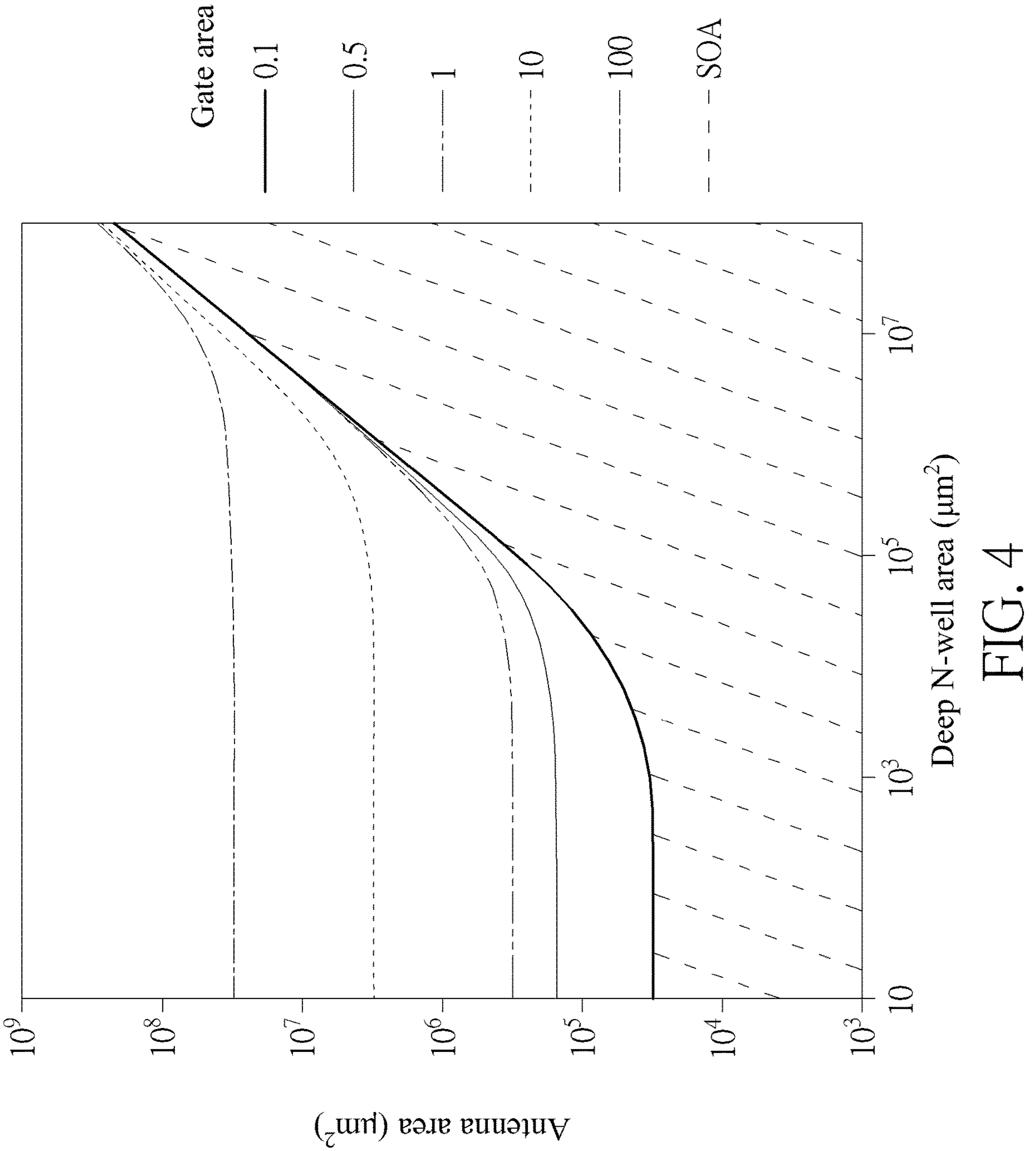
FIG. 4 is a graph of antenna area versus deep N-well area based on several gate areas.

Please refer now to FIG. 4, which is a graph of antenna area versus deep N-well area based on several gate areas, wherein Y-axis represents the area of antenna, which corresponds to the aforementioned $A_{ant}$. X-axis represents the area of deep N-well, which corresponds to the aforementioned $A_{dnw}$. The curves in the figure are drawn in accordance with the well antenna rule and formula provided above by the present invention. It can be seen in the figure that the larger the area of deep N-well, the larger the area of corresponding well antenna. The area under the curve is the safe operation area (SOA) for the circuit structure. The area of deep N-well and the area of corresponding well antenna inside the SOA are regarded as safe without the risk of well charging induced damage. Furthermore, it can be seen that with the increase of gate area (from scale 1 to 100), the corresponding curve is shifted upwardly. This represents that the SOA range becomes broader, and antenna with larger area can be accordingly set in this device, since thicker gate oxide layer is more resistant to punch-through and leakage and has higher tolerance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprises:

a substrate;

a deep N-well formed in said substrate;

a first well formed in said deep N-well;

a first gate formed on said first well;

a first source and a first drain formed respectively in said first well at two sides of said first gate;

a first doped region formed in said first well; and a metal interconnect electrically connecting with said first source and said first doped region; and a semiconductor device with a second gate formed on a third well as well as a second source and a second drain formed respectively at two side of said second gate in said third well, wherein said first gate is electrically connected with said second source of said semiconductor device.

2. The semiconductor structure of claim 1, wherein said first source and said first drain is N-type heavily doped region, and said first doped region is P-type heavily doped region.

3. The semiconductor structure of claim 1, wherein said first source and said first drain is P-type heavily doped region, and said first doped region is N-type heavily doped region.

4. The semiconductor structure of claim 1, further comprising a protection diode with a second well formed in said substrate and a second doped region formed in said second well, wherein said metal interconnect is electrically connected with said second doped region of said protection diode.

5. A semiconductor structure comprises:

a substrate;

a deep N-well formed in said substrate;

a first well formed in said deep N-well;

a first gate formed on said first well;

a first source and a first drain formed respectively at two sides of said first gate in said first well;

a first doped region formed in said first well;

a metal interconnect electrically connecting with said first source and said first doped region; and a protection diode with a second well formed in said substrate and a second doped region formed in said second well, wherein said metal interconnect is electrically connected with said second doped region of said protection diode.

6. The semiconductor structure of claim 5, wherein said first source and said first drain is N-type heavily doped region, and said first doped region is P-type heavily doped region.

7. The semiconductor structure of claim 5, wherein said first source and said first drain is P-type heavily doped region, and said first doped region is N-type heavily doped region.

8. The semiconductor structure of claim 5, further comprising a semiconductor device with a second gate formed on a third well as well as a second source and a second drain formed respectively at two sides of said second gate in said third well, wherein said first gate is electrically connected with said second source of said semiconductor device.

9. The semiconductor structure of claim 8, wherein an area of said deep N-well multiplied by a first parameter is a first factor, an area of said first gate multiplied by a second parameter is a second factor, and an area of said metal interconnect divided by a sum of said first factor and said second factor is less than a specification value.

10. The semiconductor structure of claim 5, further comprising a semiconductor device with a second gate formed on a third well as well as a second source and a second drain formed respectively at two sides of said second gate in said third well, wherein said first drain is electrically connected with said second gate of said semiconductor device.

11. A method of preventing a semiconductor structure from charging damage, comprising:

providing a semiconductor structure, said semiconductor structure comprises:

a substrate;

a deep N-well formed in said substrate;

a first well formed in said deep N-well;

a first gate formed on said first well;

a first source and a first drain formed respectively at two sides of said first gate in said first well; and a first doped region formed in said first well;

providing a metal interconnect electrically connecting with said first source and said first doped region; and providing a semiconductor device with a second gate formed on a third well as well as a second source and a second drain formed respectively at two sides of said second gate in said third well, wherein said first gate is electrically connected with said second source.

12. The method of preventing a semiconductor structure from charging damage of claim 11, further comprising connecting said metal interconnect to a protection diode.

13. The method of preventing a semiconductor structure from charging damage of claim 11, further comprising a semiconductor device with a second gate formed on a third well as well as a second source and a second drain formed respectively at two sides of said second gate in said third well, wherein said first drain is electrically connected with said second gate of said semiconductor device.

* * * * *